(12) United States Patent
Macris et al.

(10) Patent No.: US 7,755,184 B2
(45) Date of Patent: *Jul. 13, 2010

(54) LIQUID METAL THERMAL INTERFACE MATERIAL SYSTEM

(76) Inventors: Chris Macris, P.O. Box 2660, North Bend, WA (US) 98045; Robert George Ebel, 10714 Interlake Ave. North, Seattle, WA (US) 98133

( * ) Notice: Subject to any disclaimer, the term of this patent is extended or adjusted under 35 U.S.C. 154(b) by 809 days.

This patent is subject to a terminal disclaimer.

(21) Appl. No.: 11/608,429

(22) Filed: Dec. 8, 2006

(65) Prior Publication Data

US 2007/0127211 A1 Jun. 7, 2007

Related U.S. Application Data

(63) Continuation-in-part of application No. 11/248,720, filed on Oct. 11, 2005, now Pat. No. 7,554,190, which is a continuation-in-part of application No. 11/004,107, filed on Dec. 3, 2004.

(51) Int. Cl.
*H01L 23/10* (2006.01)
*H01L 23/34* (2006.01)

(52) U.S. Cl. ............ 257/706; 257/707; 257/E23.101; 257/E23.102; 257/E23.109

(58) Field of Classification Search ............... 257/706, 257/707, E23.101, E23.102, E23.109
See application file for complete search history.

(56) References Cited

U.S. PATENT DOCUMENTS

| 6,617,682 | B1 * | 9/2003 | Ma et al. ............ 257/706 |
| 6,665,186 | B1 * | 12/2003 | Calmidi et al. ............ 361/704 |
| 6,794,223 | B2 * | 9/2004 | Ma et al. ............ 438/122 |
| 7,019,971 | B2 * | 3/2006 | Houle et al. ............ 361/699 |
| 7,220,624 | B2 * | 5/2007 | Neogi et al. ............ 438/125 |
| 7,510,108 | B2 * | 3/2009 | Lawlyes et al. ............ 228/179.1 |
| 2001/0013424 | A1 * | 8/2001 | Takase et al. ............ 174/260 |

* cited by examiner

*Primary Examiner*—Ngan Ngo
(74) *Attorney, Agent, or Firm*—Robert A. Jensen; Jensen & Puntigam, P.S.

(57) ABSTRACT

A metal thermal interface structure for dissipating heat from electronic components comprised a heat spreader lid, metal alloy that is liquid over the operating temperature range of the electronic component, and design features to promote long-term reliability and high thermal performance.

64 Claims, 14 Drawing Sheets

LIQUID METAL THERMAL INTERFACE MATERIAL SYSTEM

The present application is a continuation-in-part of U.S. patent application Ser. No. 11/248,720, filed Oct. 11, 2005, which in turn is a continuation-in-part of U.S. patent application Ser. No. 11/004,107, filed Dec. 3, 2004; both applications are still pending.

TECHNICAL FIELD

This invention relates to the field of heat transfer structures between electronic components and their associated heat exchangers and, more particularly, to a thermal interface system which utilizes a metal alloy interface, materials and design features to stabilize the alloy while exposed to various environmental conditions.

BACKGROUND OF THE INVENTION

Today's electronic components generate significant amounts of heat which must be removed to maintain the component's junction temperature within safe operating limits. Failure to effectively conduct away heat leaves these devices at high operating temperatures, ultimately resulting in decreased performance and reliability and ultimately failure.

The heat removal process involves heat conduction between the electronic component and heat exchanger, or heat sink, via a thermal interface material. Small irregularities and surface asperities on both the component and heat sink surfaces create air gaps and therefore increase the resistance to the flow of heat. The thermal resistance of the interface between these two surfaces can be reduced by providing an interface material which fills the air gaps and voids in the surfaces.

An ideal medium for transferring heat from one surface to another should have low interfacial or contact thermal resistance, high bulk thermal conductivity and the ability to achieve a minimum bond-line thickness. Additional desirable qualities include product stability, ease of deployment, product reworkability, low cost and non-toxicity.

Liquids have low interfacial resistance because they wet a surface forming a continuous contact with a large area. Most liquids do not, however, have very high conductivity. Solids, and in particular metals, have very high conductivity but high interfacial resistance. Most common heat transfer materials combine highly conductive particles with a liquid or plastic in order to exploit both characteristics. Examples of the former are greases and gels while the latter include filled epoxies, silicones and acrylics. Greases have been developed with thermal conductivities significantly better than the corresponding conductivities of filled adhesives. Typical problems with greases include pumping and dry out, both of which can cause the conducting medium to lose contact with one or both of the heat transfer surfaces. Pumping occurs when the structure is deformed, due to differential thermal expansion or mechanical loads, and the grease is extruded. The oils, contained in a grease, can be depleted by evaporation or by separation and capillary flow.

Liquid metal alloys (liquid at the operating temperature of the electronic component), such as alloys of bismuth, gallium and indium, potentially offer both low interfacial resistance and high conductivity. Several alloys of gallium with very low melting points have also been identified as potential liquid metal interface materials. Thermal performance of such an interface would be more than one order of magnitude greater than many adhesives typically in use.

Although liquid metal alloys offer both low interfacial resistance and high conductivity, they have historically suffered from various reliability issues including corrosion/oxidation, intermetallic formation, drip-out, dewetting, and migration. Unless mitigated, these mechanisms will continue to degrade the interface, resulting in a thermally related catastrophic failure of the actual electronic component.

The ability to contain an electrically conductive liquid within an electronic package presents significant challenges. The liquid must be reliably retained in the thermal interface throughout the life of the package is shorting is to be avoided and effective resistance is to be minimized. To solve the problems of liquid metal migration, various seal and gasket mechanisms have been disclosed.

Although, these various mechanisms mitigate liquid metal migration, some disclosures include elastomeric or polymeric components in the thermal path which is thermally undesirable. Other disclosures include various seals which increase the bondline thickness (BLT) of the liquid metal, thereby, increasing the bulk thermal resistance of the interface. These elastomeric components are not hermetic and therefore do not prevent air or moisture from entering the thermal joint.

In addition, corrosion will propagate through the thermal interface should any air gaps be present. Surface asperities of the heat source and heat exchanger increase the potential for voids. This is further exacerbated when the metal changes between the liquid and the solid state within the temperature range of the package.

U.S. Pat. No. 4,413,766, granted to Webster on Nov. 8, 1983 discloses a void-free design to bond a metallic sheet to a ceramic substrate wherein grooves are added to the metallic sheet to facilitate gas escape.

U.S. Pat. No. 4,650,107, granted to Keser on Mar. 17, 1987 discloses a design to promote bubble-free soldering of two components wherein V-shaped perforations or mesh facilitate deaerating of the solder joint while using high clamping pressure.

U.S. Pat. No. 4,915,167, granted to Altoz, et al. on Apr. 10, 1990 discloses a low melting point thermal interface material which is contained between the heat source and heat exchanger by applying a sealant to completely encapsulate the exposed interface material.

U.S. Pat. Nos. 5,323,294 and 5,572,404, granted to Layton, et al. on Jun. 21, 1994 and Nov. 5, 1996, respectively, and U.S. Pat. No. 5,561,690, granted to Norell, et al. on Oct. 1, 1996 disclose a heat transfer module in which a compliant, absorbent body containing liquid metal is surrounded by a seal, said body is spaced apart from the seal area. As the module is clamped between a heat source and heat exchanger, liquid metal is squeezed out of the porous structure to fully fill the space within the seal area.

U.S. Pat. No. 5,909,056, granted to Mertol on Jun. 1, 1999 discloses a thermal interface structure in which a phase change thermal interface material is contained within a protrusion on a heat spreader and a dam ring, which is attached to the backside of a semiconductor chip.

U.S. Pat. No. 6,016,006, granted to Kolman, et al. on Jan. 18, 2000 discloses a method for applying thermal interface grease between an integrated circuit device and a cover plate in which a seal encloses the region of the device. Thermal grease is injected into the cavity region via an inlet port in the cover plate thereby filling the interface between device and plate.

U.S. Pat. No. 6,037,658, granted to Brodsky, et al. on Mar. 14, 2000 discloses a heat transfer surface in which a thermally conductive fluid is contained by both an absorbent medium and a seal to inhibit migration.

U.S. Pat. No. 6,097,602, granted to Witchger on Aug. 1, 2000 discloses a thermal interface structure in which a phase change interface material is surrounded by a fabric carrier dike structure. The dike is adhesively attached to both the electronic circuit package and heat sink, thereby preventing interface material from migrating from the joint.

U.S. Pat. Nos. 6,281,573 and 6,656,770, granted to Atwood, et al. on Aug. 28, 2001 and Dec. 2, 2003, respectively, disclose both a solder-based seal (between the ceramic cap/heat exchanger and package substrate) and an elastomeric gasket (between the ceramic cap/heat exchanger and chip) to "near hermetically" seal the activity containing a Gallium alloy liquid metal interface material and thereby limit oxidation and migration.

U.S. Pat. No. 6,292,362, granted to O'Neal, et al. on Sep. 18, 2001 discloses a thermal interface material module in which a flowable interface material is deposited in the center opening of a picture-frame carrier and a gasket is mounted to the carrier. With the application of heat, the reservoir area between the interface material and gasket is filled.

U.S. Pat. No. 6,665,186, granted to Calmidi, et al. on Dec. 16, 2003 discloses a liquid metal interface material held in place by a flexible seal, such as an O-ring, which also accommodates expansion and contraction of the liquid. The seal also allows for air venting and filling of liquid metal.

U.S. Pat. No. 6,732,905, granted to Humpston, et al. on May 11, 2004 discloses a method for void-free component attachment wherein a thru-hole vent is formed in the backside face of one component.

U.S. Pat. Nos. 6,761,928, 6,617,517, 6,372,997, granted to Hill et al. on Jul. 13, 2004, Sep. 9, 2003, and Apr. 16, 2002, respectively, and U.S. Pat. No. 6,940,721, granted to Hill on Sep. 6, 2005 disclose a low melting point alloy coating both sides of a surface enhanced metallic foil, thereby providing a carrier to support and contain the liquid metal alloy. The low melt alloy on the foil carrier, placed between a heat source and heat exchanger, will become molten during the operational temperatures of the heat source.

U.S. Pat. No. 6,849,941, granted to Hill, et al. on Feb. 1, 2005 disclose a liquid metal interface material in which the material is bonded (in solid form) to a solid base member and includes a sealing material set into a annular groove (within the base member) surrounding the periphery of the bonded interface.

U.S. Pat. No. 6,891,259, granted to Im, et al. on May 10, 2005 and U.S. patent application No. 20030085475, filed by Im, et al. on Oct. 10, 2002 disclose a semiconductor package in which a dam substantially surrounds the thermal interface material. The package lid includes injection holes for the dispensation of the dam and interface material.

U.S. Pat. No. 7,030,485 and U.S. Pat. Application No. 20060138644, both by Houle, et al., granted on Apr. 18, 2006 and filed on Feb. 23, 2006, respectively, discloses the use of a plastically deformable material (indium, tin, etc.) to create channels or guides between a IC chip and heat spreader. A liquid metal, such as Gallium, fills the spaces/channels and may even be circulated.

U.S. Pat. Application No. 20030173051, filed by Rinella, et al. on Mar. 12, 2002 discloses a method of forming a thermal interface in which a semi-solid metal, injected through an inlet on a heat spreader plate, fills the gap between a die and the cavity formed in the heat spreader plate.

U.S. Pat. Application No. 20030183909, filed by Chiu on Mar. 27, 2002 discloses a method of forming a thermal interface in which a thermal interface material is dispensed through and inlet in a heat spreader in order to fill the interface between the spreader and chip.

U.S. Pat. Application No. 20040217467, filed by Rumer, et al. on May 28, 2004 discloses a heat spreader comprised of a convex or concave surface which contacts a thermal interface material (between chip and heat spreader) in order to mitigate stress from thermal expansion and contraction.

U.S. Pat. Application No. 22040261980, filed by Dani, et al. on Jun. 30, 2003 discloses a heat dissipating device, such as a heat spreader, comprised of surface features (channels, grooves, serrations) to facilitate adhesion of a thermal interface material and arrest interface cracking on delamination.

U.S. Pat. Application No. 20040262766, filed by Houle on Jun. 27, 2003 discloses a liquid metal interface contained within a cold-formed o-ring barrier positioned directly on the chip. Once the barrier is established between the heat spreader and chip, liquid metal is introduced into the interface via a channel in the spreader.

U.S. Pat. Application No. 20050073816, filed by Hill on Jan. 7, 2004 discloses a liquid metal interface assembly in which an o-ring or shim sealing member surrounds the liquid metal interface material to shield the interface from the atmosphere.

U.S. Pat. Application No. 2006131738, filed by Furman, et al. on Sep. 6, 2005 discloses a liquid metal layer with diffusion barrier layers on both interface surfaces and a wetting layer over each barrier layer. The liquid metal may also include metallic or inert particles for viscosity modification.

FIGS. 1A through 3 (Prior Art) show various methods of forming a void-free, high thermal performance thermal interface within electronic assemblies 100. FIG. 1A illustrates an electronic assembly 100 comprised of a thermal interface structure 102 positioned between a heat spreader lid 104 and electronic component 106, which is comprised of an IC chip 108, package substrate 110 and electrical interconnection vias 112. The interface structure 102 is comprised of a metallic core 120 encapsulated by a metallic interface composition 122. An adhesive layer 114 bonds the heat spreader lid 104 to the electronic component package substrate 110. It can be seen in FIG. 1B that the lid 104 has now been mounted to the package substrate 110 with an adhesive layer 114 located on the lid flange 116. During operation of the electronic component 106, the resultant heat will cause excess metallic interface composition 122 to flow out of the thermal interface, thereby creating a fillet outside the IC chip perimeter. Unfortunately, oxidation, present on the surface of the metallic interface composition 122 prior to heating and flowing, creates a "skin" and prohibits filling of the surface asperities present on the lid 104 and IC chip 108. FIG. 1c, a magnified sectional view of FIGS. 1a and 1b, illustrates the resultant air gaps 123 due to the layer of oxidation 125 inhibiting flow of interface material. The non-hermetic interface allows oxygen and moisture to penetrate into these air gaps 123 and continue oxidation/corrosion of the metallic interface composition 122 within the interface between chip 108 and lid 104.

Within FIG. 2 (Prior Art), it can be seen that a metallic thermal interface composition is injected (by a dispenser 124) through a hole 126 in the heat spreader lid 104 to yield a filled thermal interface joint 128. Without a barrier or seal, interface material would have the tendency to migrate out of the joint. The use of a seal will promote full filling of the thermal joint as well. Additionally, the hole 126, filled with the interface composition would certainly possess lower thermal conductivity than the typical materials (copper, aluminum) comprising heat spreader lids.

FIG. 3 (Prior Art), similar to FIG. 2, illustrates an electronic assembly 100 comprised of a thermal interface structure 130 sandwiched between and IC chip 108 and heat spreader lid 104. The lid 104 includes at least one gas permeable plug 132 located within holes 134 in the lid 104. A barrier or seal 136 is placed near the perimeter of the IC chip 108, thereby creating a seal and space between the lid 104 and IC chip 108. Liquid interface material 138 is injected into the holes 134 in the lid 104, thereby filling the space comprising the thermal interface joint. Should the barrier be of polymeric composition, heat transfer would be reduced near the perimeter of the chip. A metallic barrier would require a bonding and hermetic seal in order for the gas permeable plugs to be effective. Barrier bonding may induce unwanted stresses between the IC chip 108 and the lid 104. Additionally, the holes 134 in the lid would also created undesirable thermal impedance between the chip 108 and lid 104.

SUMMARY OF THE INVENTION

Accordingly, it is the overall feature of the present invention to provide an improved thermal interface system in order to more effectively transfer thermal energy from an electronic component to a heat exchange structure.

An additional feature of the present invention is to provide an improved metal thermal interface system which is liquid over the operating temperature of the electronic component, thereby minimizing the stresses placed on the electronic component by the heat exchange structure.

Yet, another feature of the present invention is to provide a corrosion resistant interface system in which the metallic interface composition flows and fills the surface asperities on both the electronic component and heat exchanger thereby sealing the interface from moisture and oxygen.

A further feature of the present invention is to provide an improved metal thermal interface system which includes structures to vent entrapped air between the electronic component and heat exchanger, thereby increasing heat transfer and environmental reliability.

Still another feature of the present invention is to provide an improved metal thermal interface system which includes structures to absorb thermomechanical stresses induced by thermal expansion differences between the electronic component and heat exchanger.

One additional feature of the present invention is to provide a metallic interface composition including oxygen gettering elements to promote wetting to oxide layers present on the surface of the electronic component chip and heat exchanger.

Lastly, it is a feature of the present invention to combine all of these unique design aspects and individual fabrication techniques into effective and manufacturable thermal interface system for electronic components, including Flip Chip integrated circuit (IC) packages.

DETAILED DESCRIPTION OF THE INVENTION

Figure 1A:
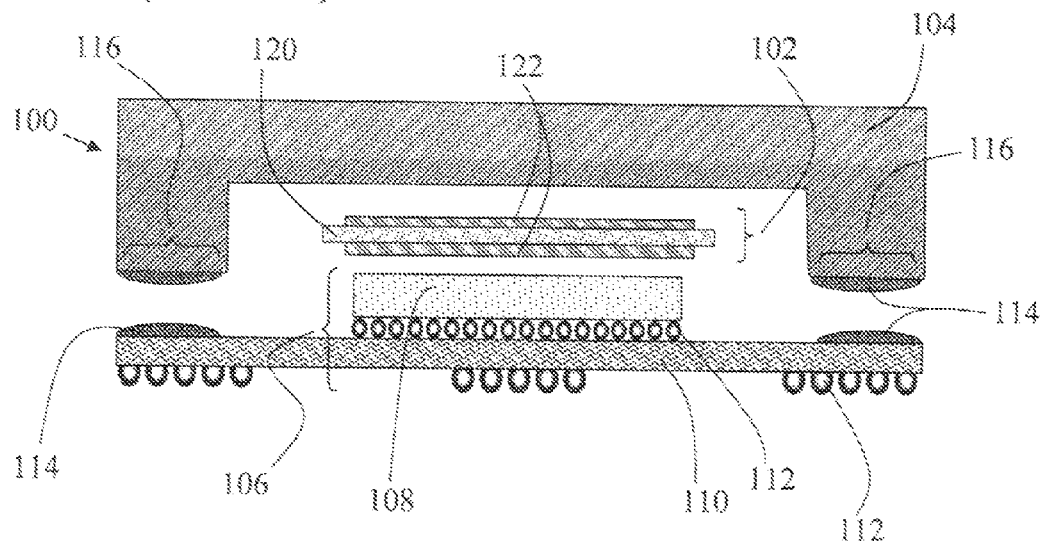
FIGS. 1a through 1c, sectional views, illustrate an electronic assembly including a foil-based thermal interface structure deployed between an IC chip and heat spreader lid, as known in the art.
Figure 1B:
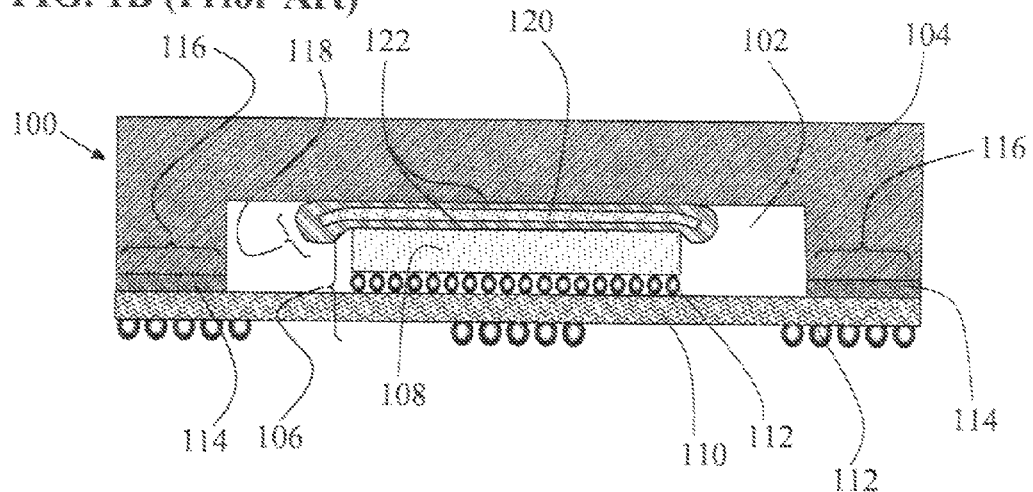
Figure 1C:
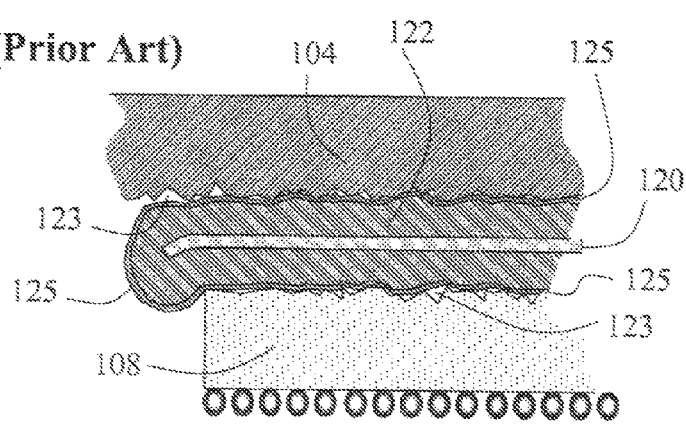
Figure 2:
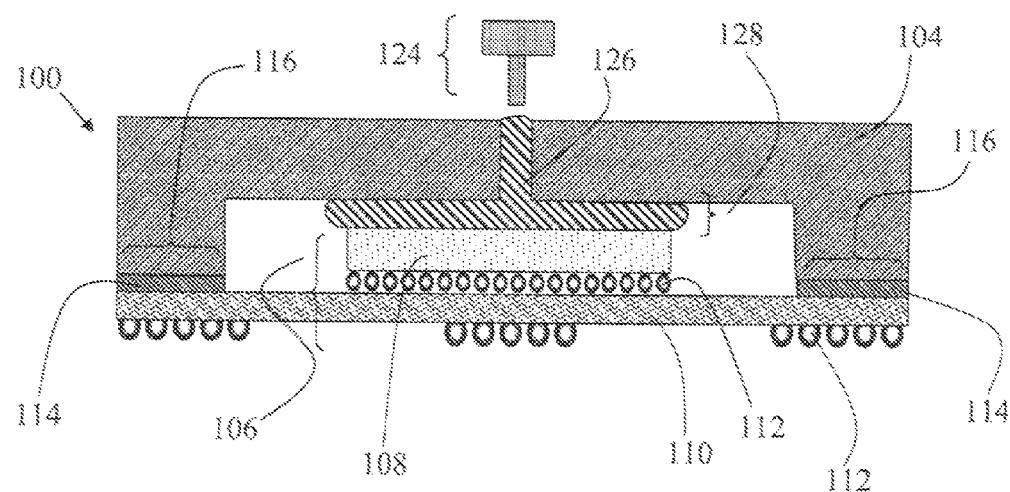
FIG. 2, a sectional view, illustrates an electronic assembly in which thermal interface material is injected through a hole in the heat spreader lid, as known in the art.
Figure 3:
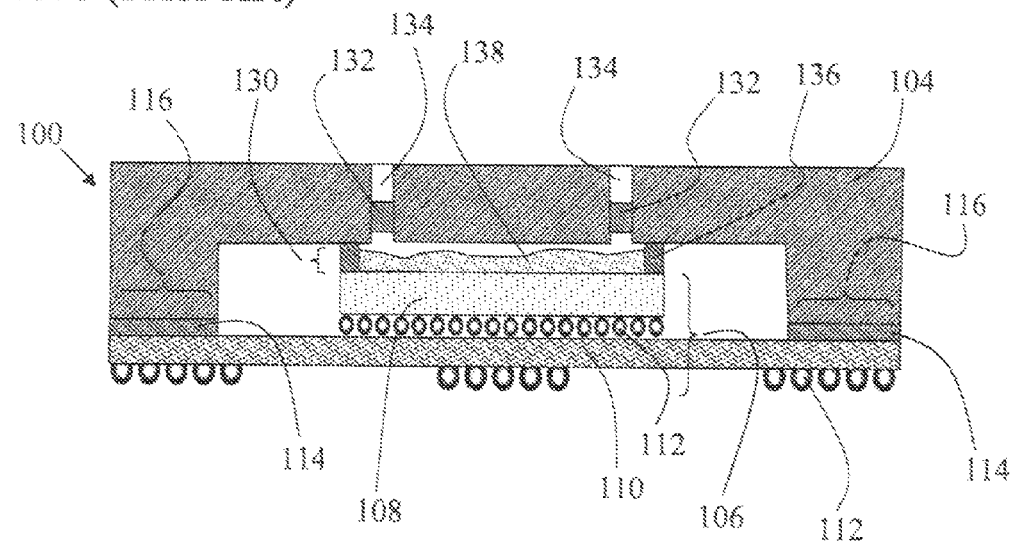
FIG. 3, a sectional view, illustrates an electronic assembly in which thermal interface material is added through a vent to fill the space inside of a barrier formed between the IC chip and lid, as known in the art.

Described below are several embodiments of the present invention which illustrate various ways the present invention can be implemented. In the descriptions that follow, like numerals represent like numerals in all figures. For example, where the numeral 100 is used to refer to a particular element in one figure, the numeral 100 appearing in any other figure refers to the same element.

FIGS. 4a through 4d illustrate a sequence of the present invention in which the thermal interface structure 140 flows and fills the space between the electronic component and heat exchanger to yield a highly conductive and hermetic thermal interface joint. An electronic assembly 100 includes a heat exchanger 104 (depicted as a heat spreader lid), a thermal interface structure 140 positioned between the lid 104 and an electronic component 106. The component 106 is comprised of an IC chip 108, package substrate 110 and electrical interconnection vias 112 (on the chip 108 and substrate 110).

Figure 4A:
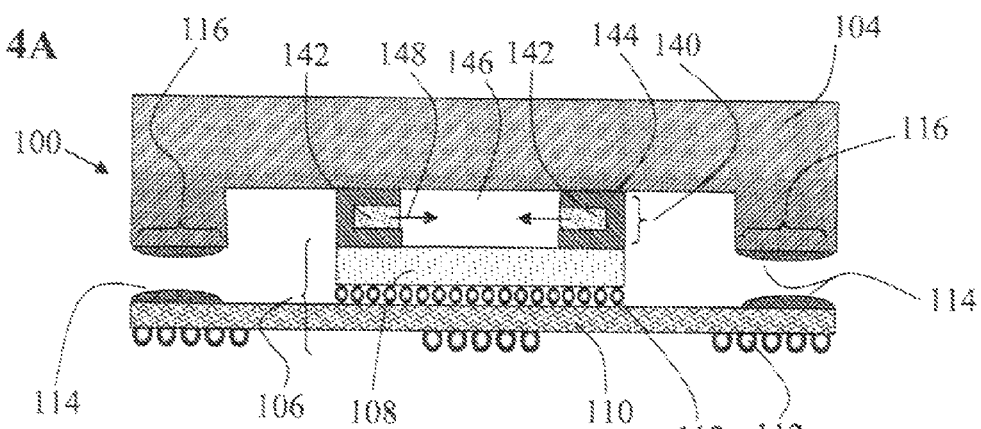
FIGS. 4a through 4d, sectional views, illustrate the sequence of flowing, filling, and sealing of metallic interface material within a thermal interface joint of the present invention.

Within FIG. 4a, a thermal interface structure 140 includes a metallic seal member 142 (comprised of an inner and outer perimeter) which is positioned near the perimeter of the IC chip 108 and is comprised of a metallic interface composition. It can be seen that the metallic seal member 142 does not extend beyond the periphery of the IC chip 108. A coating layer 144 encapsulates the metallic seal member on all faces with the exception of the inner perimeter of the member 142. The coating layer 144 may be of metallic of polymeric composition.

The interface structure 140, when disposed between the lid 104 and IC chip 108, creates an interface space 146 between the electronic component and heat spreader and a seal to each of their respective surfaces. With the application of heat (from the electronic component 106 or external source), the metallic seal member 142 will flow (flow arrows 148) into the space 146 and fill all the surface asperities of both heat spreader lid and IC chip.

Figure 4B:
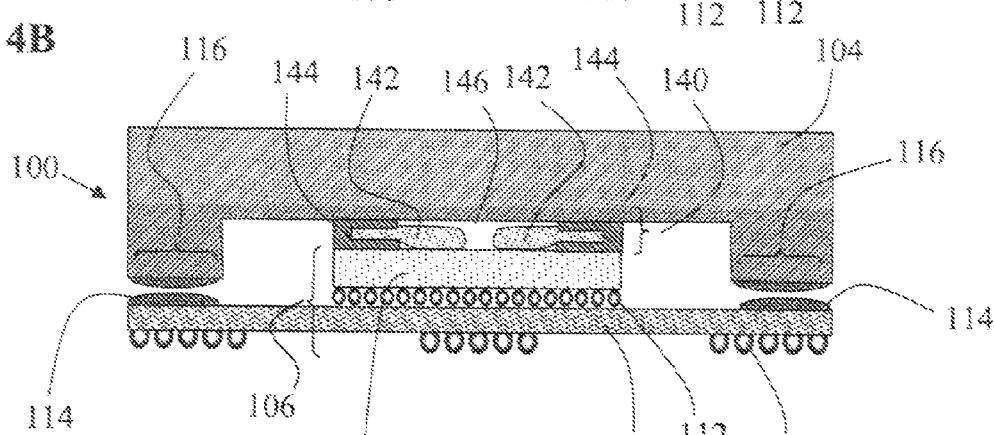

FIG. 4b illustrates the melting and flowing on the liquefied metallic interface composition comprising the metallic seal member 142. Pressure applied external to the lid 104 or the weight of the heat exchanger 104 also promotes the flowing of the liquefied metallic seal member 142 and filling of the interface space 146. As the seal member 142 continues to melt, the space 146 between the lid 104 and IC chip 108 is reduced in volume.

Figure 4C:
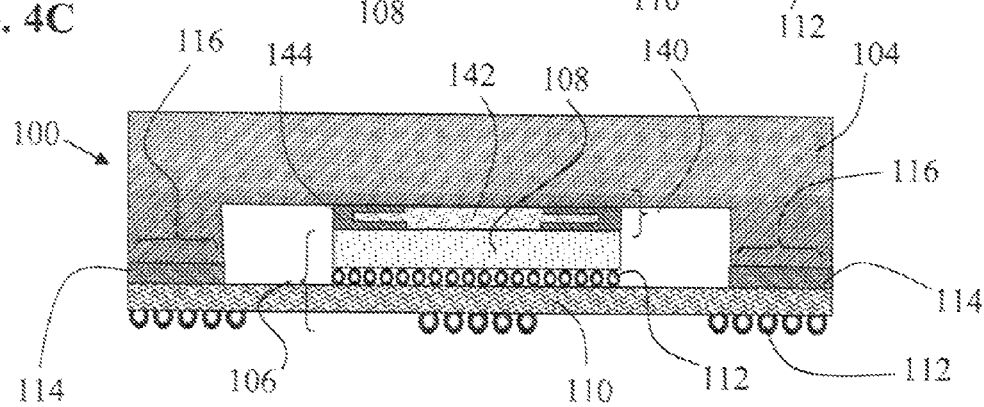

As seen in FIG. 4c, the interface space 146 between the lid 104 and IC chip 108 has been fully filled with the metallic interface composition, comprising the metallic seal member 142. The coating layer 144 assists in containing the flowing interface composition within the perimeter of the metallic seal member 142. Due to the collapse of the metallic seal member 142 during melting, the adhesive layer 114, applied to the heat spreader lid 104 at the outer lid flange 116 and package substrate 110, is now bonded to the electronic component package substrate 110. Seal materials include silicones, polysulphides, polyurethanes, polyimides, polyesters, epoxides, cyanate esters, olefins and sealing glasses. A continuous seal may be applied between the heat spreader lid flange 116 and package substrate 110, thereby reducing the amount of moisture ingression within the lid cavity.

Figure 4D:
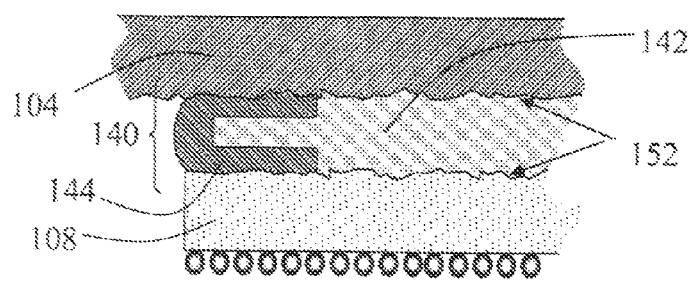

FIG. 4d, a magnified view of FIGS. 4a through 4c, illustrates the filling of surface asperities 152 present on the IC chip 108 and heat spreader lid 104. To enhance heat transfer, an asperity filling material, such as a grease or phase change polymeric compound, may be disposed on the coating layer where it contacts either the IC chip or heat exchanger.

The metallic interface composition (comprising the metallic seal member 142) may be comprised of the metallic elements of bismuth, gallium, indium and tin and their alloys.

It is desirable for the composition to be liquid over the operating temperature of the electronic component. This allows the metal to adequately flow into all surface asperities of the heat spreader lid 104 and IC chip 108 and accommodate thermomechanical stresses from temperature cycling.

In another embodiment of the present invention, "reactive" elements or intrinsic oxygen gettering elements are added to the metallic interface composition to further facilitate wetting to the lid 104 and IC chip 108. The resulting composition has a higher affinity for surface oxides and promotes oxide to oxide bonding, thereby reducing the thermal impedance at the lid 104 and chip 108 contact interfaces. Oxygen getter elements include alkali metals (Li, Na, and K), alkaline-earth metals (Mg and Ca), zinc, refractory metals (Ti, Zr, Hf, Ta, V and Nb), rare earth metals (La, Ce, Pr, Nd, Sm, Eu, Gd, Tb, Dy and Yb), and mixtures and alloys thereof.

Figure 5A:
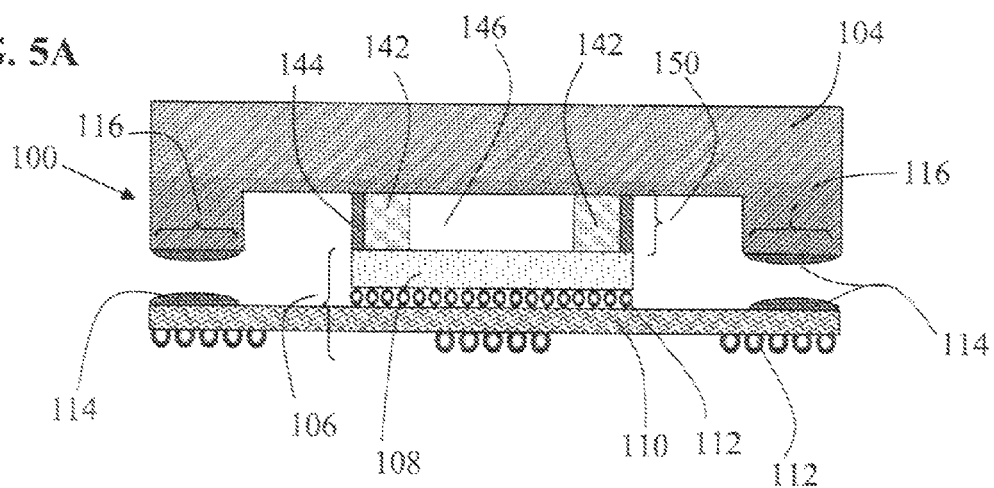
FIGS. 5a and 5b, sectional views, illustrate another sealing embodiment of the present invention.
Figure 5B:
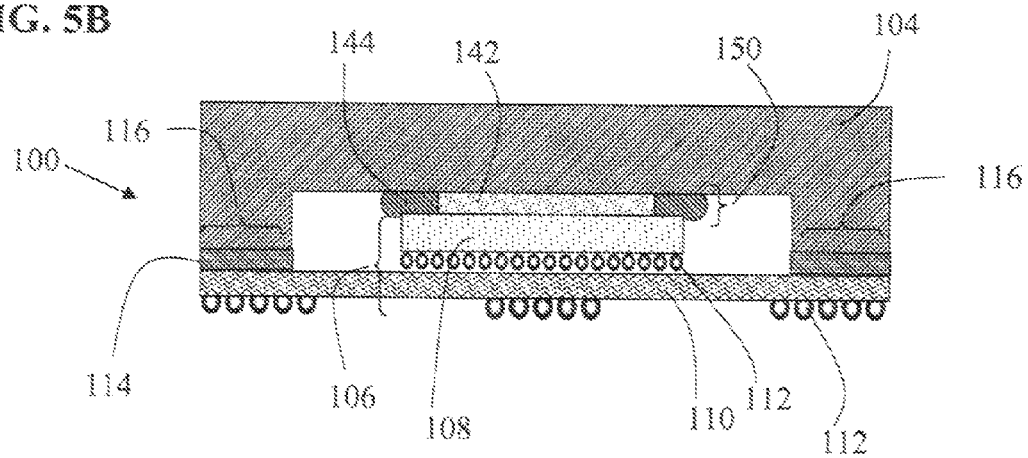

Within FIGS. 5a and 5b, another thermal interface structure of the present invention is illustrated as a sequence of interface formation.

FIG. 5a, a similar electronic assembly structure 100 to FIGS. 4a-4c, includes a thermal interface structure 150 comprised of a metallic seal member 142 (comprised of a metallic interface composition) with an inner and outer perimeter. A coating layer 144 is shown surrounding the outer perimeter of the metallic seal member 142.

FIG. 5b illustrates the fully flowed thermal interface structure 150 in which the interface space 146 between the IC chip 108 and lid 104 has been filled with the metallic interface composition comprising the metallic seal member 142.

Figure 6:
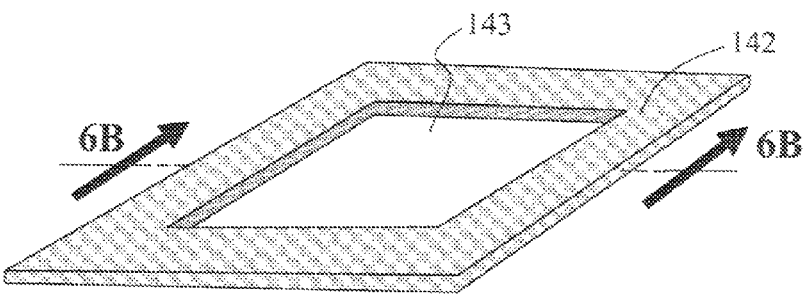
FIG. 6, an isometric view, illustrates a metallic interface composition formed as a metallic seal in the present invention.

FIG. 6 (an isometric view) illustrates a metallic seal member 142 (comprised of a metallic interface composition) and inner perimeter 143 (and therefore outer perimeter) seen in FIGS. 4a through 4c and FIGS. 5a and 5b.

Figure 7A:
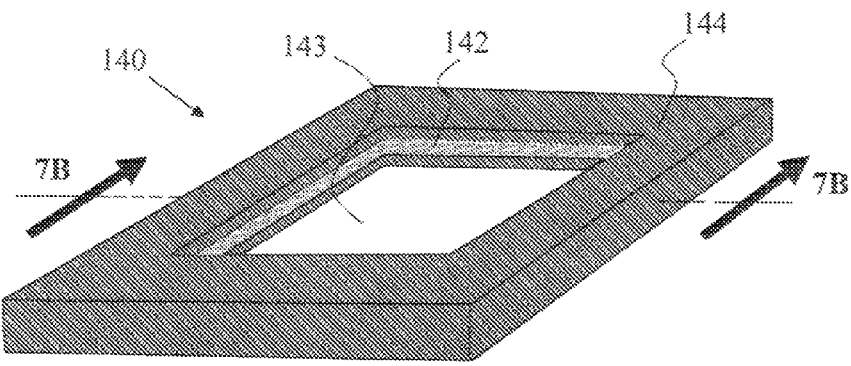
FIGS. 7a and 7b, an isometric and sectional view, respectively, illustrate a coating layer encapsulating the metallic interface composition in all faces with the exception of the inner perimeter within the present invention.

The thermal interface structure 140 of FIGS. 7A (an isometric view) and 7B (a sectional view of FIG. 7a on lines 7B-7B) includes a metallic seal member 142 with an inner perimeter 143, however, a coating layer 144 encapsulates all surfaces of the metallic seal member with the exception of the inner perimeter 143.

Figure 8:
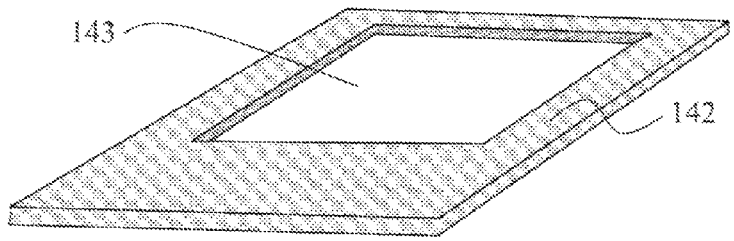
FIG. 8, an isometric view, illustrates another metallic interface composition embodiment wherein the resultant metallic seal is asymmetrical.

Similar to FIG. 6, FIG. 8 illustrates a metallic seal member 142 (comprised of a metallic interface composition); however, the seal is asymmetrical, resulting in a preferred direction of liquefied metallic interface composition flow into the inner perimeter 143 (mitigating entrapped air and facilitating venting).

Figure 7B:
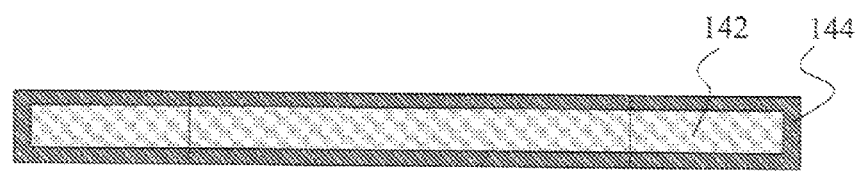
Figure 9:
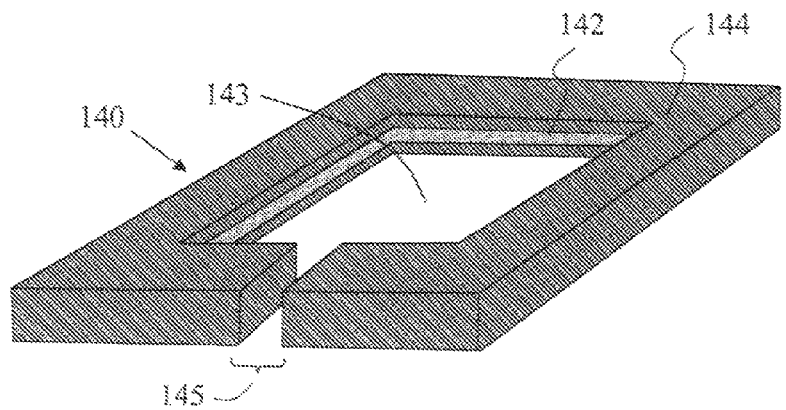
FIG. 9, an isometric view, illustrates another embodiment of the present invention in which the coating layer encapsulates a discontinuous metallic interface composition, comprising the metallic seal, in all faces with the exception of the inner perimeter within the present invention.
Figure 10A:
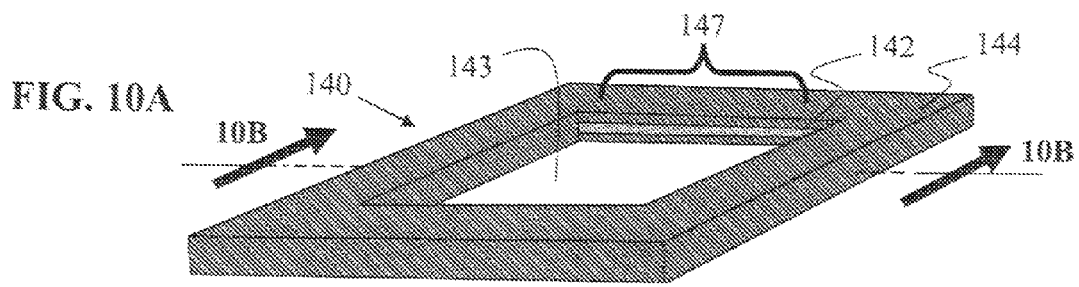
FIGS. 10A and 10B, an isometric and sectional view, respectively, illustrate the coating layers partially encapsulating the inner perimeter of the metallic seal.
Figure 10B:
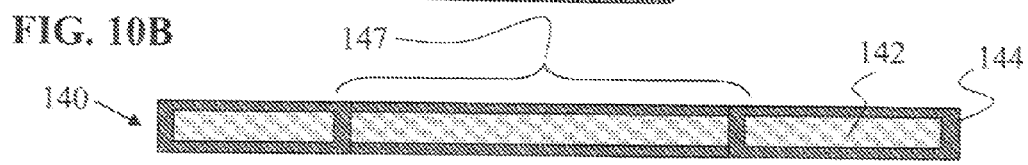
Figure 11A:
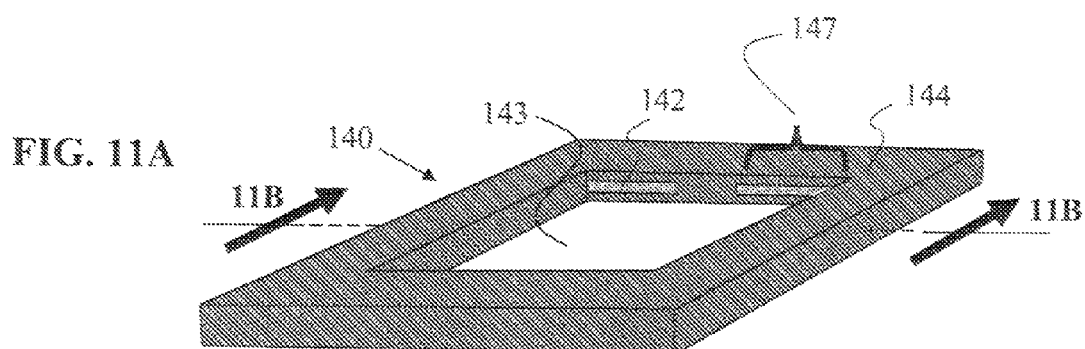
FIGS. 11A and 11B, an isometric and sectional view, respectively, illustrate another embodiment of the present invention wherein coating layers partially encapsulate the inner perimeter of the metallic seal.
Figure 11B:
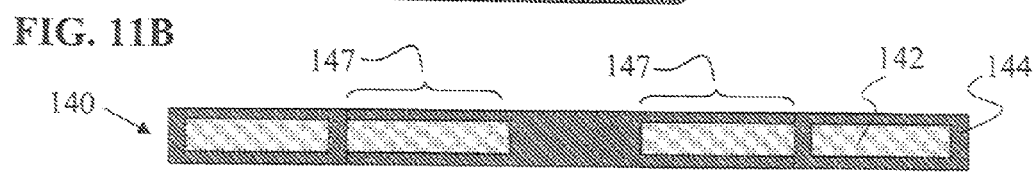
Figure 12A:
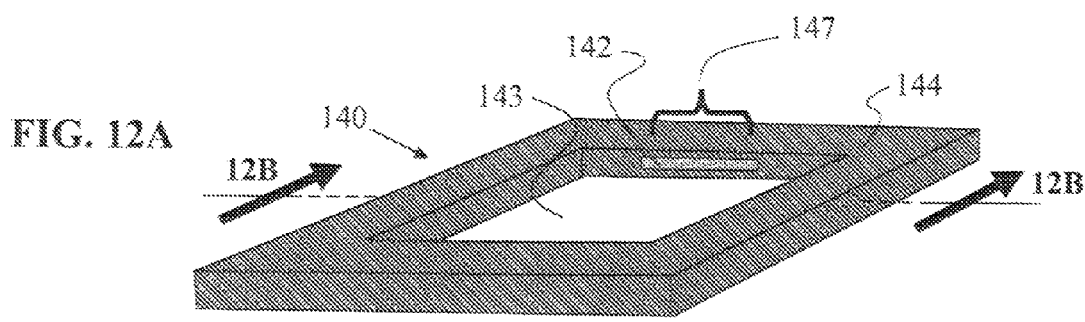
FIGS. 12A and 12B, an isometric and sectional view, respectively, illustrate yet another embodiment of the present invention wherein coating layers partially encapsulate the inner perimeter of the metallic seal.
Figure 12B:
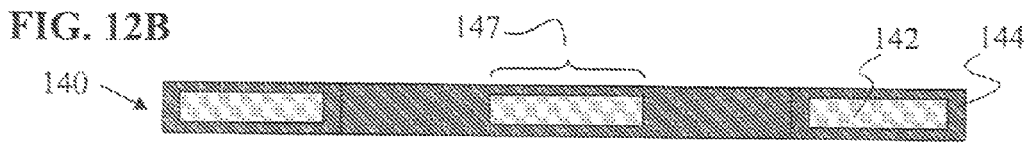

Similar to FIGS. 7A and 7B, the thermal interface structure 140 of FIG. 9 now includes a discontinuous metallic seal member 142 with gap 145 to facilitate the removal of entrapped air during the flowing of the liquefied metallic interface composition. A coating layer 144 encapsulates all surfaces of the metallic seal member with the exception of the inner perimeter 143.

The thermal interface structures 140 of FIGS. 10A, 10B, 11A, 11B, 12A and 12B all include a metallic seal member 142 and inner perimeter 143 (similar to FIGS. 7 and 9); however, the coating layer 144 encapsulates all surfaces of the metallic seal member 142 with the exception of an inlet region 147 within the inner perimeter 143. This partial encapsulation within the inner perimeter 143 is designed to direct the flow of the liquefied metallic interface composition, thereby facilitating the venting of entrapped air.

Figure 13A:
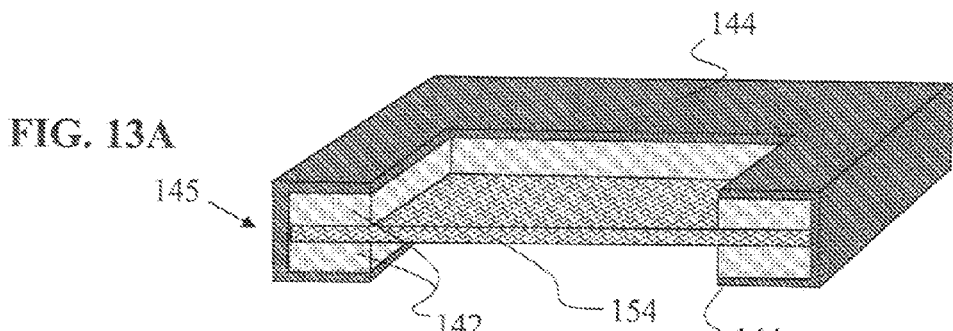
FIGS. 13A and 13B, an isometric and sectional view, respectively, illustrate another embodiment of the present invention including a solid metallic core disposed within the metallic interface composition.
Figure 13B:
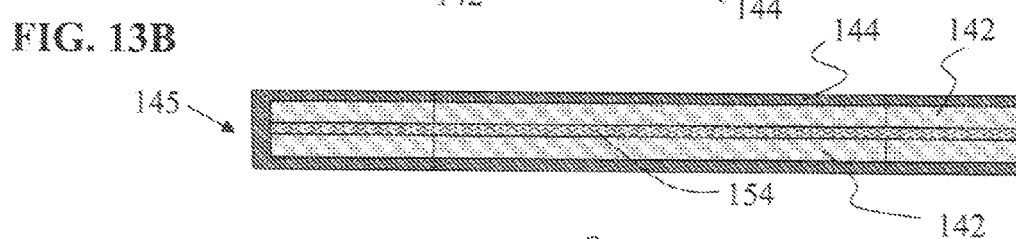

Within FIG. 13A (a sectioned isometric view) and FIG. 13B (a side view), the thermal interface structure 145 includes a solid metallic core 154 which is disposed within the metallic interface composition, comprising the metallic seal member 142. The metallic core 154 includes two faces wherein the liquefied metallic interface composition (comprising the metallic seal member 142) flows onto at least one face of the solid metallic core 154, filling surface asperities. The core 154 may be comprised of a high conductivity metal or metal alloy such as copper or aluminum.

Figure 14:
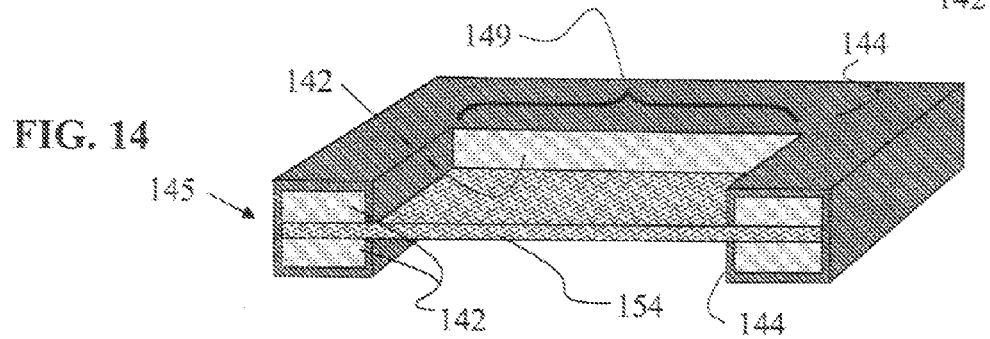
FIG. 14, an isometric view, illustrates another solid metallic core embodiment of the present invention wherein coating layers partially encapsulate the inner perimeter of the metallic seal.
Figure 15:
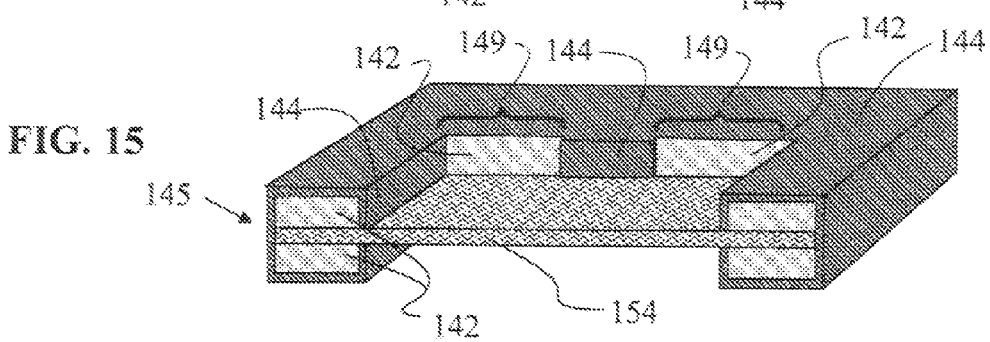
FIG. 15, an isometric view, illustrates yet another solid metallic core embodiment of the present invention wherein coating layers partially encapsulate the inner perimeter of the metallic seal.
Figure 16:
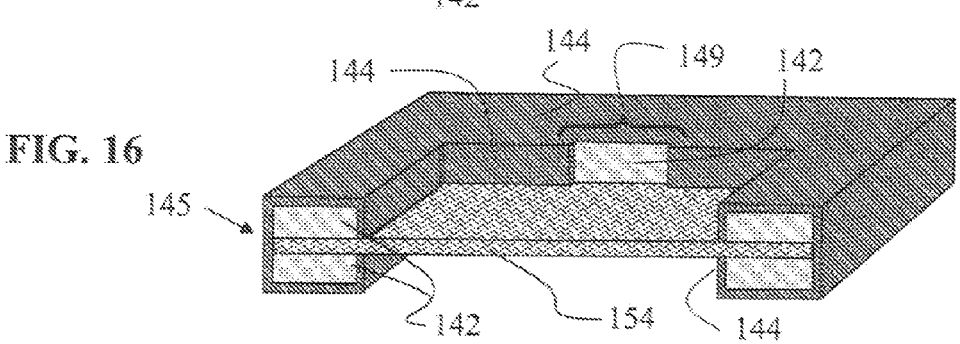
FIG. 16, an isometric view, illustrates still another solid metallic core embodiment of the present invention wherein coating layers partially encapsulate the inner perimeter of the metallic seal.

FIGS. 14, 15, 16 illustrate multiple partial encapsulation embodiments with a solid metallic core 154. Similar to FIGS. 9 through 11, the metallic seal member 142 is encapsulated with the exception of an inlet region(s) 149 within the inner perimeter. The inlets 149, located on both sides of the metallic core 154, direct the flowing metallic interface composition (when liquid) in order to flush the entrapped air within the inner perimeter 143 of the metallic seal member 142.

Figure 17A:
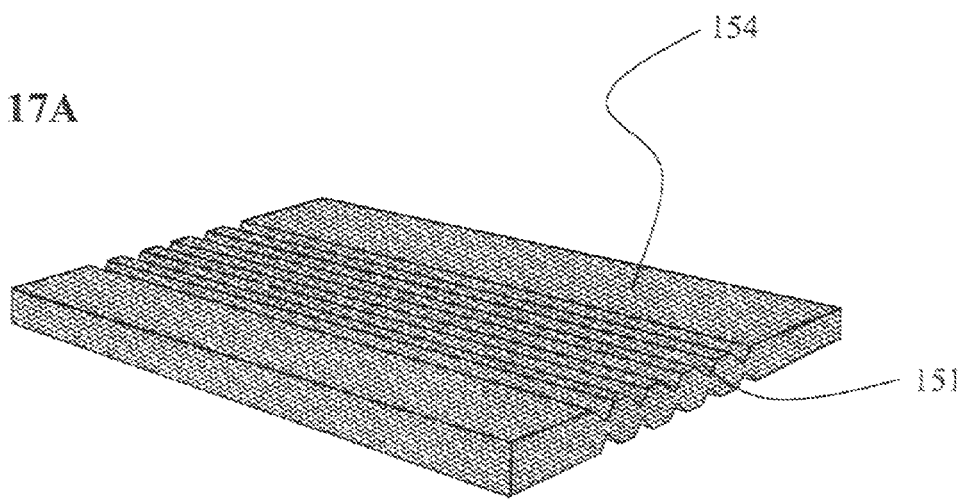
FIGS. 17A and 17B, both isometric views, illustrate another embodiment of the present invention including a solid metallic core with vent passages (depicted as grooves) is disposed within the metallic interface composition.

Within FIG. 17A, a metallic core 154 includes vent passages 151 in the form of grooves, or slots, in both faces of the core 154 to facilitate venting of entrapped air.

Figure 17B:
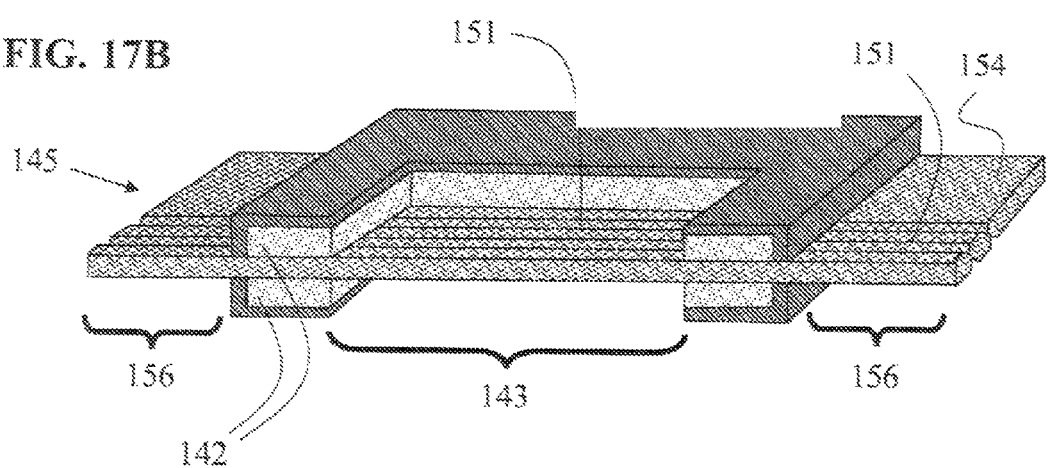

FIG. 17B includes a metallic seal member 142 and coating layer 144 (on both faces of a metallic core 154) with vent passages 151. As the liquefied metallic interface composition (comprising the metallic seal member 142) flows, the coating layer 144 forces the composition to fill the inner perimeter, or space 143. Any entrapped air within the inner perimeter 143 is vented through the vent passages 151 to the outer perimeter region 156 of the seal member 142.

Similar to FIGS. 17A through 17C, FIGS. 18A through 18C illustrate a metallic core 154 with vent passages 151 (depicted as slots) in both faces of the core 154. The core is then clad with a mesh, or filter media 155 (over the vent passages 151). As the liquefied metallic interface composition (comprising the metallic seal member 142) flows, the vent passages 151 (with the filter media 155) will allow any entrapped air to escape from the inner perimeter 143, yet the media 155 will prohibit the passage of metallic interface composition.

The filter media 155 can either prevent the flowing metallic interface composition from entering the vent passages 151 (within the inner perimeter 143) or prevent the interface composition from escaping the vent passages 151 in the outer perimeter region 156 of the seal member 142.

Figure 18A:
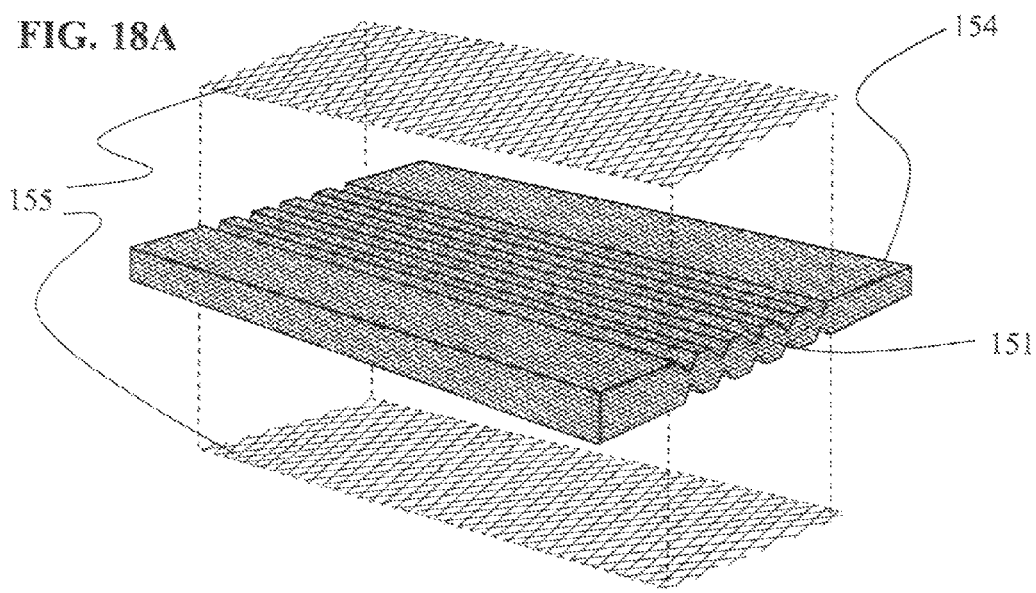
FIGS. 18A through 18C, all isometric views, illustrate another embodiment of the present invention including a solid metallic core with vent passages clad with a mesh.
Figure 18B:
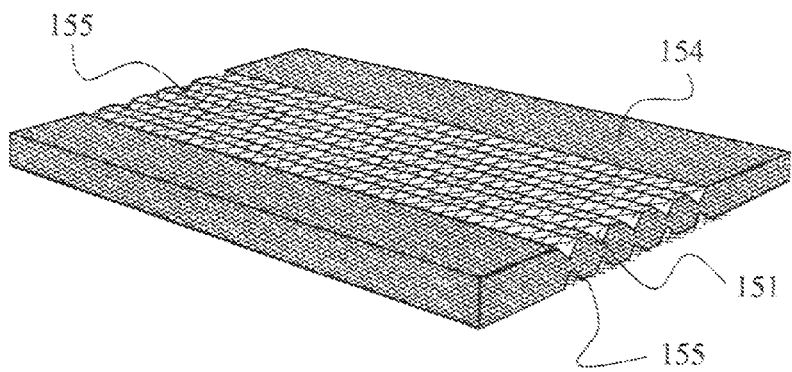
Figure 18C:
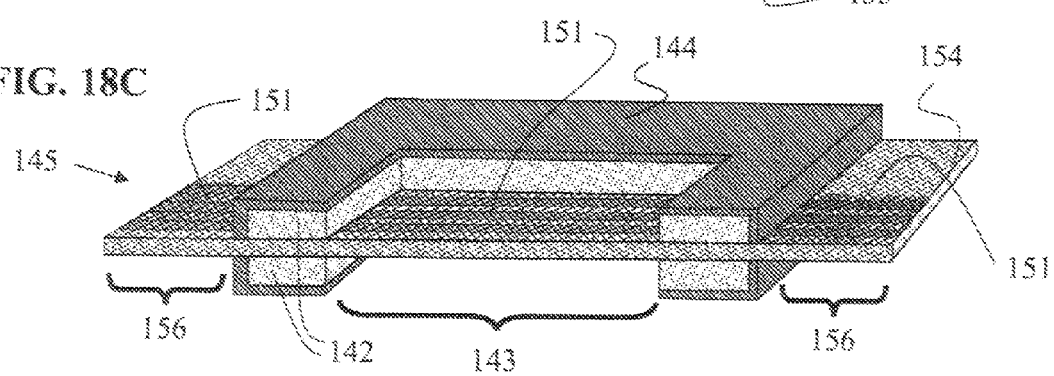
Figure 19:
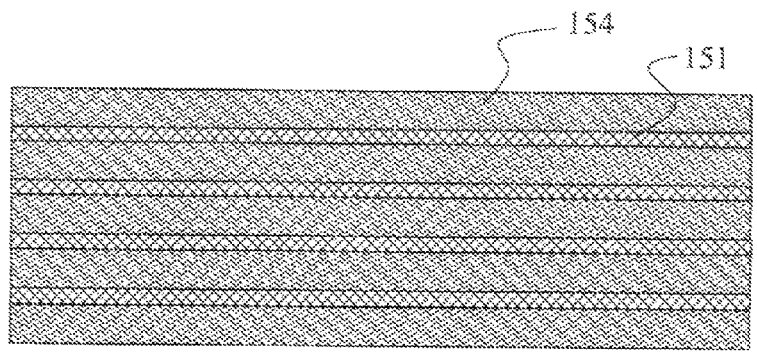
FIG. 19, an isometric view, illustrates another embodiment of the present invention wherein the mesh selectively clads the vent passages within the metallic core.

FIG. 19, similar to FIGS. 18A and 18B, illustrates a metallic core 154 with the selective placement of mesh or filter media on top of each vent passage 151.

Figure 20:
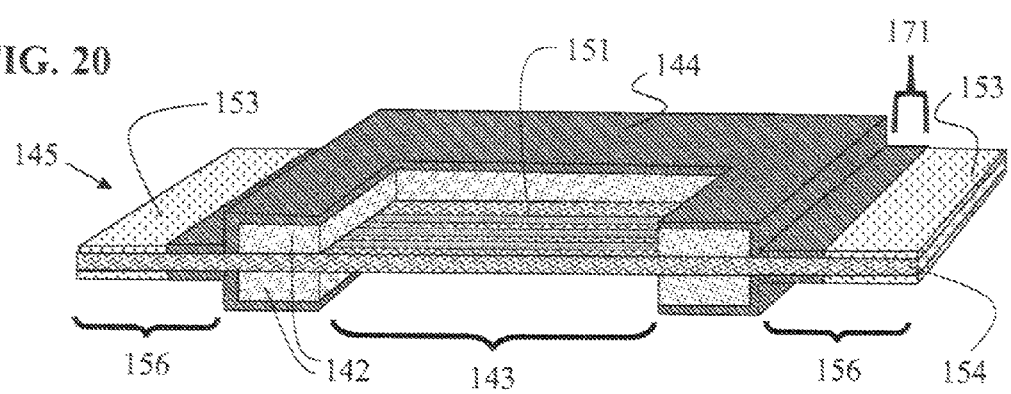
FIG. 20, an isometric view, illustrates another embodiment of the present invention wherein a filter media is positioned above the vent passages outside the metallic core perimeter.

FIG. 20 illustrates a thermal interface structure 145 comprised of a metallic core 154 with vent passages 151 passing from the metallic seal 142 inner perimeter 143 to the outer perimeter region 156 where a filter media 153 covers the exposed vent passages 151. This media 153 will allow entrapped in to vent from the inner perimeter 143 to the outer perimeter 156; however, the media 153 will also prevent the interface composition from escaping the vent passages 151 in the outer perimeter region 156 of the seal member 142. It can also be seen that the coating layer 144 extends a distance 171 from the metallic seal member's outer perimeter 156. The increased distance (more contact area) would increase adhesion of the coating layer 144 to the core 154.

Figure 21:
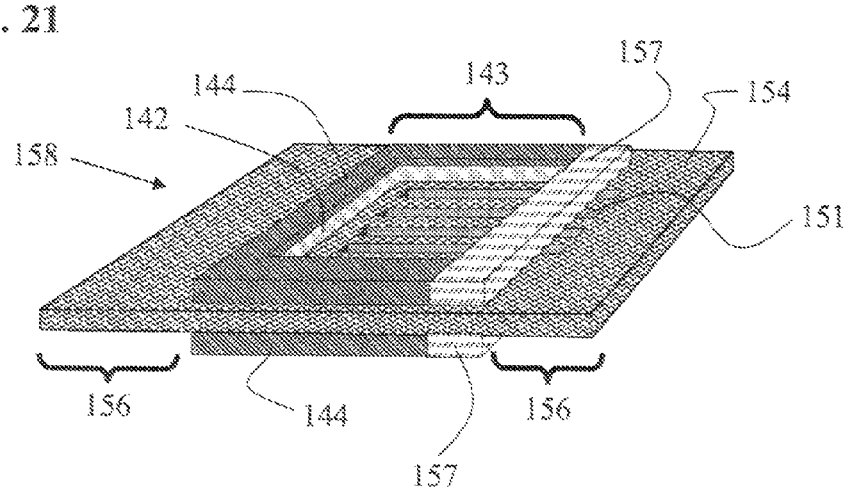
FIG. 21, an isometric view, illustrates a discontinuous metallic seal with vent passages within a solid metallic core.

Within the thermal interface structure 158 of FIG. 21, it can be seen that a metallic core 154, with vent passages 151, includes a metallic seal member 142 (comprised of a discontinuous metallic interface composition) and encapsulating layer or structure 157. The combined layer 157 and seal member 142 comprise a continuous seal which (further facilitated by the coating layer 144) forces the metallic interface composition to flow into the inner perimeter 143. The vent passages 151 flush entrapped air (from the inner perimeter 143) to the outer perimeter 156.

Figure 22A:
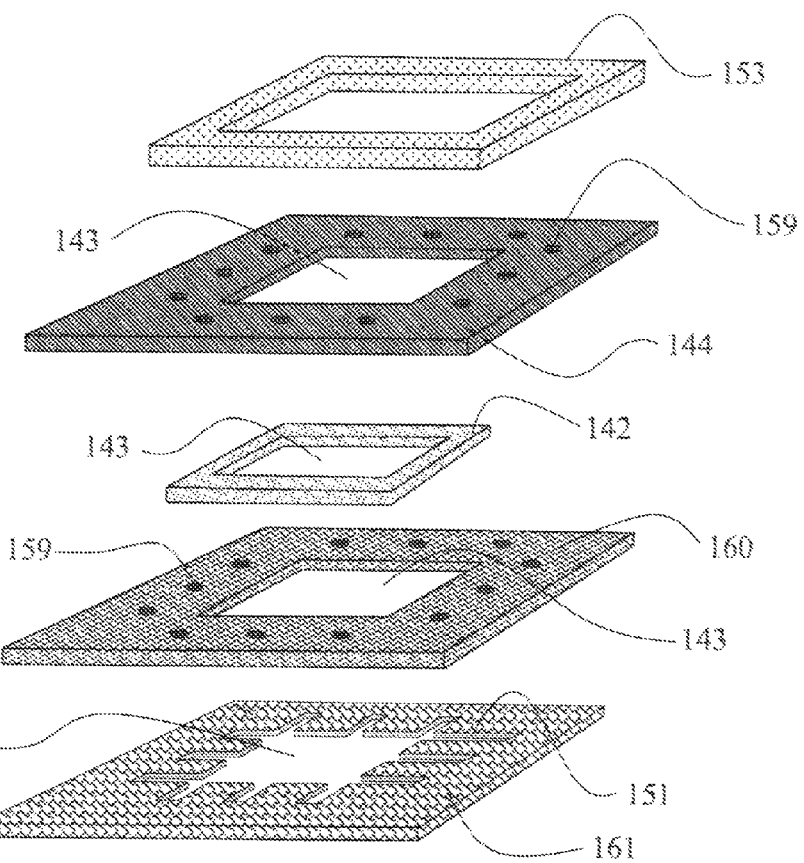
FIGS. 22a through 22c (two isometric views and one sectional view) illustrate an embodiment of the present invention wherein entrapped air is allowed to pass through a filtering layer, yet any metallic interface composition cannot pass.
Figure 22B:
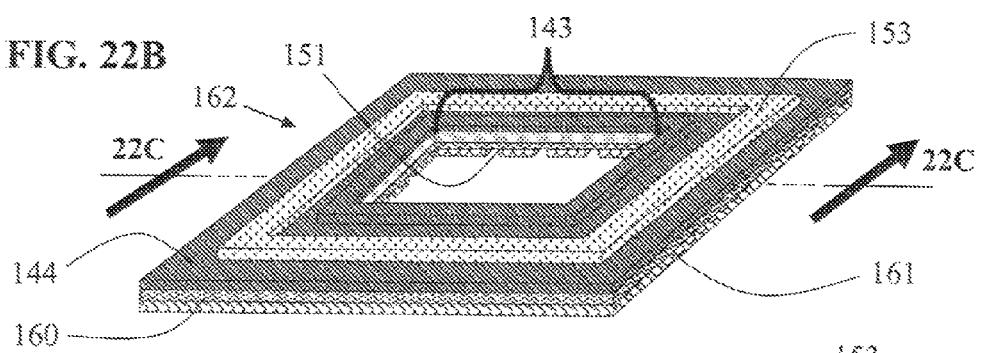
Figure 22C:
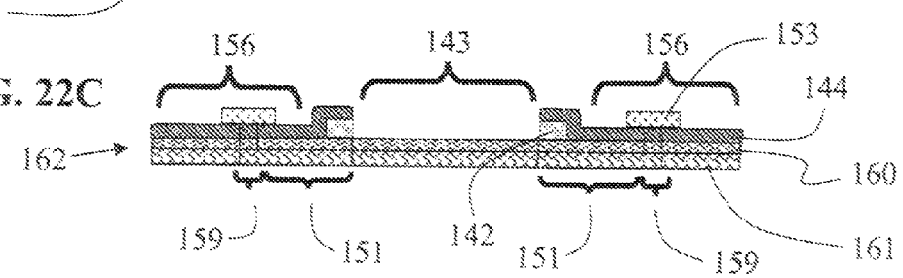
Figure 23A:
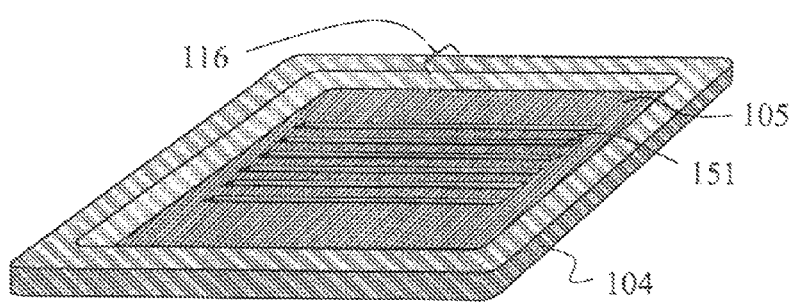
FIGS. 23a through 23d, one isometric and three sectional views, illustrate venting of entrapped air by the vent passages within the heat exchanger (during the sequence of flowing, filling, and sealing of metallic interface material) within a thermal interface joint of the present invention.
Figure 23B:
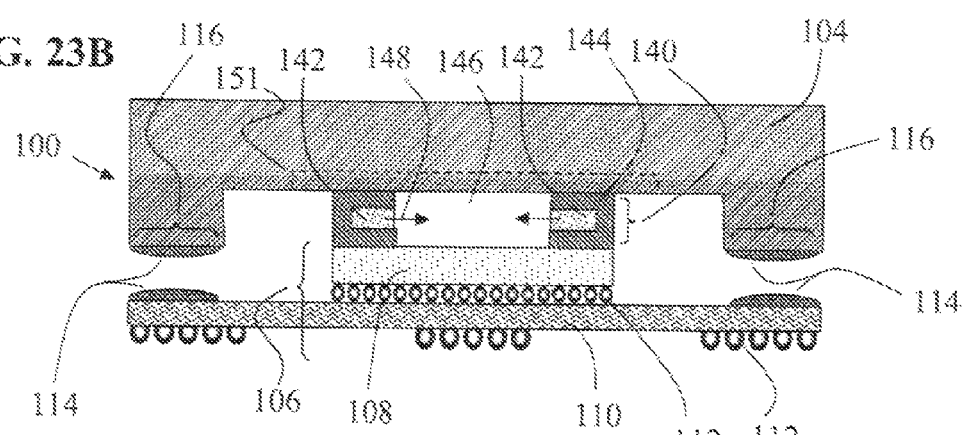
Figure 23C:
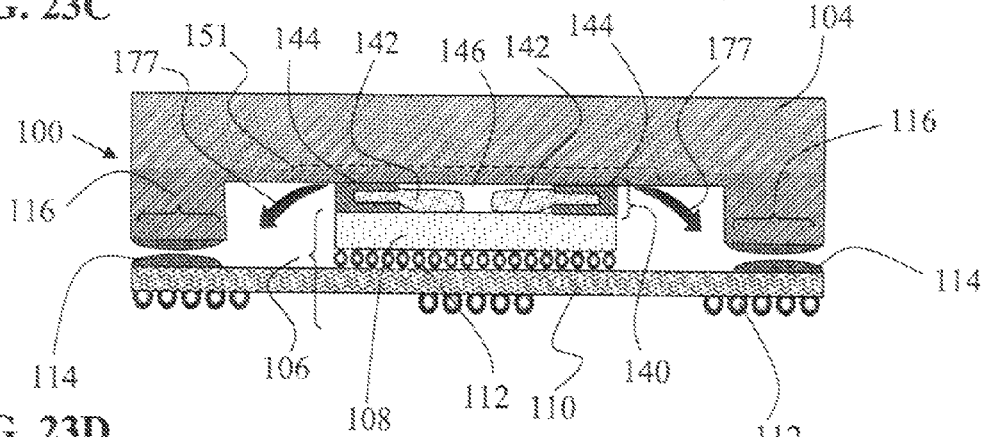
Figure 23D:
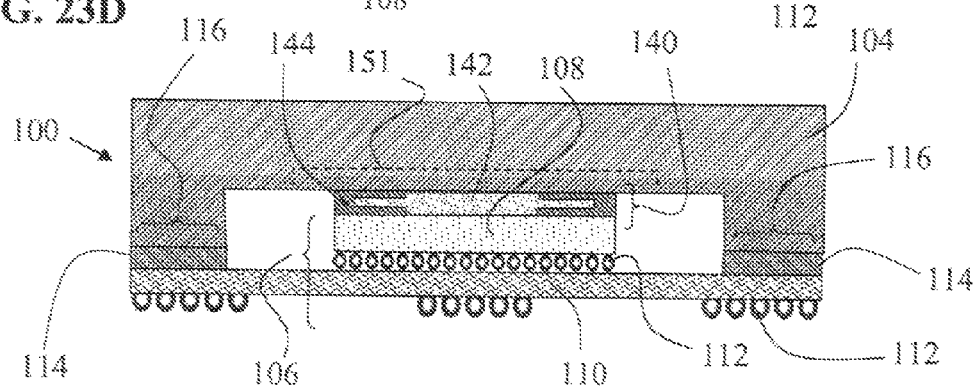

FIGS. 22A through 22C illustrate the assembly of individual layers to yield a complete thermal interface structure 162 embodiment of the present invention.

As seen in FIG. 22A, a channel layer 161 includes an inner perimeter aperture 143 with vent passages 151 extending outward. The channel layer may be a solid transfer adhesive to facilitate bonding to subsequent layers (and to either the heat exchanger or IC chip). A core layer 160 includes an inner perimeter aperture 143 and vertical vents 159 which correspond to the terminations of the vent passages 151 within the channel layer 161. The core layer may be comprised of a high conductivity metal or carbonaceous material.

A metallic seal member 142 (comprised of a metallic interface composition) with an inner perimeter aperture 143 is sandwiched between the core layer 160 and coating layer 144. The coating layer also includes an inner perimeter 143 and vertical vents 159 corresponding to the vents within the core layer 160. Similar to the channel layer 161, this coating layer may be comprised of a solid transfer adhesive. A filter media layer 153 is applied to the regions of the coating layer 144 corresponding to the vertical vents 159 of the coating and core layers 144 and 160, respectively.

The resultant thermal interface structure 162 can be seen in FIGS. 22B and 22C. As the liquefied metallic interface composition (comprising the metallic seal member 142) flows into the inner perimeter 143, entrapped air will exit through the vent passages 151 and vertical vents 159 to the outer perimeter 156 of the metallic seal 142; however, metallic interface composition is prohibited from passing through the filter media layer 153.

FIGS. 23A through 23D, similar to FIGS. 4a through 4d, illustrate a sequence of the present invention in which the thermal interface structure 140 flows and fills the space between the electronic component and heat exchanger to yield a highly conductive and hermetic thermal interface joint.

An electronic assembly 100 includes a heat exchanger 104 (depicted as a heat spreader lid in FIG. 23A) with vent passages 151 formed within the pocket 105 of the heat spreader 104. A thermal interface structure 140 is positioned between the lid 104 and an electronic component 106. The component 106 is comprised of an IC chip 108, package substrate 110 and electrical interconnection vias 112. As the liquefied metallic interface composition, comprising the metallic seal member 142 flows, entrapped air 177 in the space 146 is vented via the vent passages 151 to the region outside the metallic seal member outer perimeter.

Figure 24A:
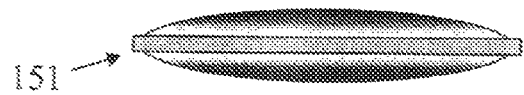
FIGS. 24A and 24B, a sectional and isometric view, respectively, illustrate a solid metallic core of a convex shape thereby facilitating a thicker metallic interface composition layer near the periphery of the electronic component.
Figure 24B:
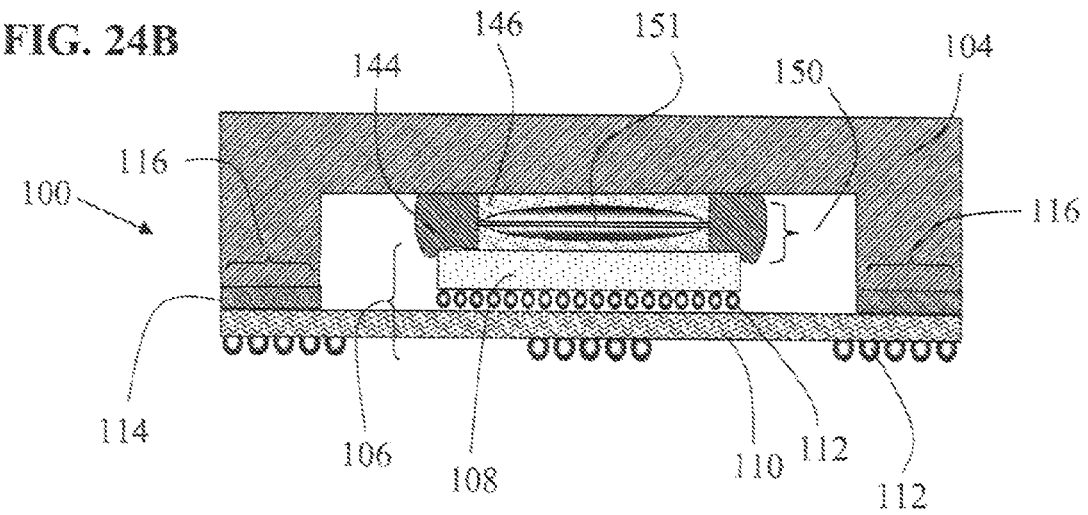

Now, within FIGS. 24A and 24B, it can be seen that a convex shaped metallic core 151 is positioned between the electronic component 108 and heat spreader 104. The resultant flowing and filling of the metallic interface composition into the space 146 yields a thicker deposit near the perimeter of the electronic component. The thicker interface composition mitigates thermomechanical stresses which are concentrated near the edges of the component 108.

As another embodiment of FIGS. 4A through 4D, FIG. 25 illustrates the thermal interface structure 172 after the metallic seal member has melted and flowed into space 146 between the lid 104 and chip 108.

Figure 25:
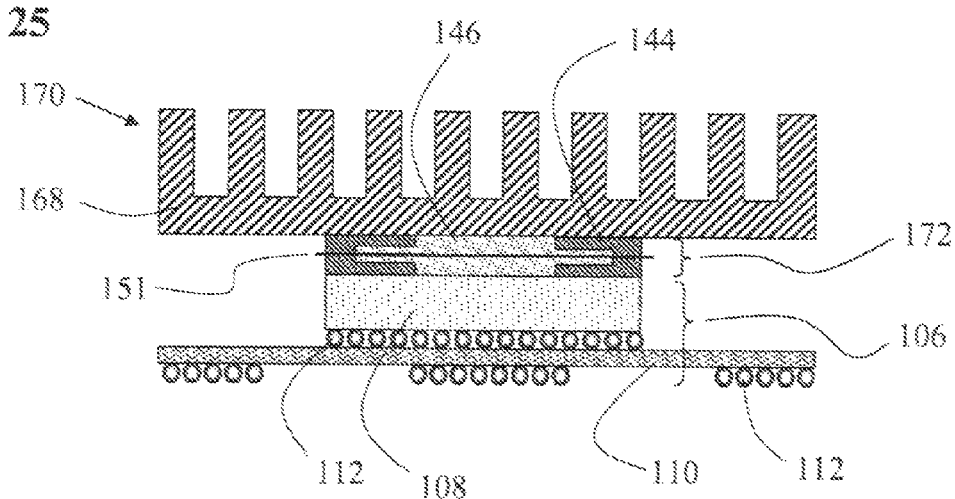
FIG. 25, a sectional view, illustrates one interface material structure embodiment of the present invention between an IC chip and heat sink.

FIG. 25 illustrates an electronic assembly 170 including an electronic component 106 (comprised of an IC chip 108, package substrate 110, and electrical interconnection vias 112), heat exchanger (heat sink) 168, and thermal interface structure 172. The thermal interface structure 172 includes a metallic core 151 between a metallic seal member (comprised of a metallic interface composition), illustrated as the space 146, coating layer 144, and facilitates a thermal path between the IC chip 108 and heat sink 168.

Figure 26:
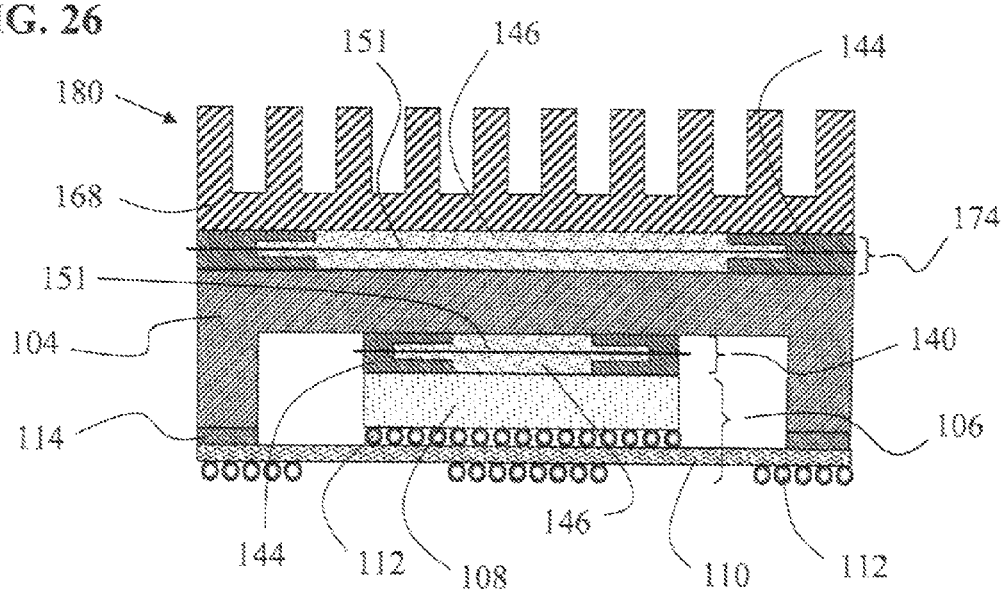
FIG. 26, a sectional view, illustrates one interface material structure embodiment of the present invention positioned between an IC chip and heat spreader lid and between the lid and heat sink.

Within FIG. 26, it can be seen that the electronic assembly 180 includes two heat exchangers, a heat spreader lid 104 (with a thermal interface structure 140 between the lid 104 and IC chip 108) and a heat sink 168 with a thermal interface structure 174 between both heat exchangers. The resultant electronic assembly, providing an all metal heat path from the IC chip 108 and heat sink 168, would possess high thermal performance with a high degree of reliability and ease of deployment.

Several embodiments of the present invention have been described. A person skilled in the art, however, will recognize that many other embodiments are possible within the scope of the claimed invention. For this reason, the scope of the invention is not to be determined from the description of the embodiments, but must instead be determined solely from the claims that follow.

The invention claimed is:

1. An electronic assembly including an electronic component, heat exchanger, and thermal interface structure comprised of a metallic interface composition, the assembly comprising:
   (a) a metallic interface composition disposed between the electronic component and heat exchanger, said metallic interface composition positioned near the periphery of the electronic component thereby forming a washer shaped metallic seal member, and said seal member including an inner and outer perimeter, said inner perimeter surrounding a space devoid of metallic interface composition; and
   (b) the liquefied metallic interface composition is able to flow, filling surface asperities and the interfacial space, said space defining the metallic seal which includes at least one vent.

2. The assembly in claim 1 wherein the metallic seal member is encapsulated with the exception of the inner perimeter.

3. The assembly in claim 1 wherein the inner perimeter of the metallic seal member is partially encapsulated to direct the flow of the metallic interface composition.

4. The assembly in claim 1 wherein the metallic seal member, positioned near the periphery of the electronic component, is discontinuous.

5. The assembly in claim 4 wherein an encapsulating layer and discontinuous metallic interface composition comprise a continuous metallic seal member, with an inner and outer perimeter.

6. The assembly in claim 1 wherein the vent connects the space, defined by the metallic seal inner perimeter, to the region outside of the metallic seal outer perimeter.

7. The assembly in claim 1 wherein the vent passes entrapped air and prohibits the passage of the metallic interface composition.

8. The assembly in claim 1 wherein a solid metallic core of high conductivity, including two faces, is disposed between the electronic component and heat exchanger and the metallic interface composition is flowed onto at least one face thereby filling surface asperities.

9. The assembly in claim 8 wherein the metallic interface composition is thicker near the periphery of the electronic component.

10. The assembly in claim 8 wherein the solid metallic core includes at least one vent, on at least one face, connecting the space, defined by the metallic seal inner perimeter, to the region outside of the metallic seal outer perimeter.

11. The assembly in claim 1 wherein the metallic interface composition includes an intrinsic oxygen getter selected from the group consisting of rare earth metals, alkali metals, alkaline-earth metals, refractory metals, and mixtures and alloys thereof.

12. The assembly in claim 1 wherein the metallic interface composition is liquid at the operating temperature range of the electronic component.

13. The assembly in claim 1 wherein the metallic seal member does not extend beyond the periphery of the IC chip comprising the electronic component.

14. A thermal interface structure for transferring heat from an electronic component to a heat exchanger, the structure comprising:
   (a) a metallic interface composition disposed between the electronic component and heat exchanger, said metallic interface composition positioned near the periphery of the electronic component thereby forming a washer shaped metallic seal member, and said seal member including an inner and outer perimeter, said inner perimeter surrounding a space devoid of metallic interface composition; and
   (b) the liquefied metallic interface composition is able to flow, filling surface asperities and the interfacial space, said space defining the metallic seal which includes at least one vent.

15. The structure in claim 14 wherein the metallic seal member is encapsulated with the exception of the inner perimeter.

16. The structure in claim 14 wherein the inner perimeter of the metallic seal member is partially encapsulated to direct the flow of the metallic interface composition.

17. The structure in claim 14 wherein the metallic seal member, positioned near the periphery of the electronic component, is discontinuous.

18. The structure in claim 17 wherein an encapsulating layer and discontinuous metallic interface composition comprise a continuous metallic seal member, with an inner and outer perimeter.

19. The structure in claim 14 wherein the vent connects the space, defined by the metallic seal inner perimeter, to the region outside of the metallic seal outer perimeter.

20. The structure in claim 14 wherein the vent passes entrapped air and prohibits the passage of the metallic interface composition.

21. The structure in claim 14 wherein a solid metallic core of high conductivity, including two faces, is disposed between the electronic component and heat exchanger.

22. The structure in claim 14 wherein the liquefied metallic interface composition is able to flow onto at least one face of the solid metallic core thereby filling surface asperities.

23. The structure in claim 22 wherein the metallic interface composition is thicker near the periphery of the electronic component.

24. The structure in claim 21 wherein the solid metallic core includes at least one vent, on at least one face, connecting the space, defined by the metallic seal inner perimeter, to the region outside of the metallic seal outer perimeter.

25. The structure in claim 14 wherein the metallic seal member is asymmetrical to direct the flow of the liquefied metallic interface composition.

26. The structure in claim 14 wherein the heat exchanger is a heat spreader lid.

27. The structure in claim 14 wherein the metallic interface composition includes an intrinsic oxygen getter selected from the group consisting of rare earth metals, alkali metals, alkaline-earth metals, refractory metals, and mixtures and alloys thereof.

28. The structure in claim 14 wherein the metallic interface composition is liquid at the operating temperature range of the electronic component.

29. The structure in claim 14 wherein the metallic seal member does not extend beyond the periphery of the IC chip comprising the electronic component.

30. A thermal interface structure for transferring heat from an electronic component to a heat exchanger, the structure comprising:
    (a) a metallic interface composition disposed between the electronic component and heat exchanger, said metallic interface composition positioned near the periphery of the electronic component thereby forming a washer shaped metallic seal member, and said seal member including an inner and outer perimeter, said inner perimeter surrounding a space devoid of metallic interface composition;
    (b) the liquefied metallic interface composition is able to flow, filling surface asperities and the interfacial space, said space defining the metallic seal which includes at least one vent; and
    (c) a coating layer encapsulating the outer perimeter of the metallic seal member.

31. The structure in claim 30 wherein the inner perimeter of the metallic seal member is partially encapsulated to direct the flow of the metallic interface composition.

32. The structure in claim 30 wherein the vent connects the space, defined by the metallic seal inner perimeter, to the region outside of the metallic seal outer perimeter.

33. The structure in claim 32 wherein the vent passes entrapped air and prohibits the passage of the metallic interface composition.

34. The structure in claim 30 wherein the coating layer is metallic.

35. The structure in claim 30 wherein an asperity filling material is disposed on the coating layer, thereby contacting heat exchanger and electronic component.

36. The structure in claim 30 wherein the heat exchanger is a heat spreader lid.

37. The structure in claim 30 wherein the metallic interface composition includes an intrinsic oxygen getter selected from the group consisting of rare earth metals, alkali metals, alkaline-earth metals, refractory metals, and mixtures and alloys thereof.

38. The structure in claim 30 wherein the metallic interface composition is liquid at the operating temperature range of the electronic component.

39. A thermal interface structure for transferring heat from an electronic component to a heat exchanger, the structure comprising:
    (a) a metallic interface composition disposed between the electronic component and heat exchanger, said metallic interface composition positioned near the periphery of the electronic component thereby forming a washer shaped metallic seal member, and said seal member including an inner and outer perimeter, said inner perimeter surrounding a space devoid of metallic interface composition;
    (b) a solid metallic core, including two faces, comprised of a high conductivity metal, disposed between the electronic component and heat exchanger; and
    (c) the liquefied metallic interface composition is able to flow onto at least one face of the solid metal core, filling surface asperities and the interfacial space, said space defining the metallic seal which includes at least one vent.

40. The structure in claim 39 wherein the metallic seal member is encapsulated by a coating layer on all sides with the exception of the inner perimeter.

41. The structure in claim 40 wherein the coating layer extends a distance from the outer perimeter of the metallic seal.

42. The structure in claim 39 wherein the inner perimeter of the metallic seal member is partially encapsulated to direct the flow of the metallic interface composition.

43. The structure in claim 39 wherein the metallic seal member, positioned near the periphery of the electronic component, is discontinuous.

44. The structure in claim 43 wherein an encapsulating layer and discontinuous metallic interface composition comprise a continuous metallic seal member, with an inner and outer perimeter.

45. The structure in claim 39 wherein the metallic interface composition is thicker near the periphery of the electronic component.

46. The structure in claim 39 wherein the solid metallic core includes at least one vent, on at least one face, connecting the space, defined by the metallic seal inner perimeter, to the region outside of the metallic seal outer perimeter.

47. The structure in claim 46 wherein the vent passes entrapped air and prohibits the passage of the metallic interface composition.

48. The structure in claim 39 wherein the solid metallic core includes a diffusion barrier layer.

49. The structure in claim 48 wherein the solid metallic core is comprised of a metallic interface composition wetting layer over the diffusion barrier layer.

50. The structure in claim 40 wherein an asperity filling material is disposed on the coating layer, thereby contacting heat exchanger and electronic component.

51. The structure in claim 39 wherein the heat exchanger is a heat spreader lid.

52. The structure in claim 39 wherein the metallic interface composition includes an intrinsic oxygen getter selected from the group consisting of rare earth metals, alkali metals, alkaline-earth metals, refractory metals, and mixtures and alloys thereof.

53. The structure in claim 39 wherein the metallic interface composition is liquid at the operating temperature range of the electronic component.

54. The structure in claim 39 wherein the metallic seal member does not extend beyond the periphery of the IC chip comprising the electronic component.

55. The structure in claim 39 wherein the thermal interface structure is adhesively attached to the heat exchanger.

56. A method of manufacturing an electronic assembly including at least one IC chip comprising an electronic component, at least one heat exchanger and at least one thermal interface structure, comprised of a metallic interface composition formed as a seal member including an inner and outer perimeter, the method comprising:
  (a) Forming a sandwich comprised of the electronic component, heat exchanger and thermal interface structure wherein the metallic interface composition is disposed between the electronic component and heat exchanger, said metallic interface composition positioned near the periphery of the electronic component thereby forming a washer shaped metallic seal member, and said seal member includes an inner and outer perimeter, said inner perimeter surrounding a space devoid of metallic interface composition; and
  (b) Heating the thermal interface structure causing the liquefied metallic interface composition to flow onto at least one face of the solid metal core, filling surface asperities and the interfacial space, said space defining the metallic seal which includes at least one vent.

57. The method of claim 56 wherein the metallic seal member is encapsulated with the exception of the inner perimeter.

58. The method of claim 56 wherein the vent connects the space, defined by the metallic seal inner perimeter, to the region outside of the metallic seal outer perimeter.

59. The method of claim 56 wherein the vent passes entrapped air and prohibits the passage of the metallic interface composition.

60. The method of claim 56 wherein a solid metallic core of high conductivity, including two faces, is disposed between the electronic component and heat exchanger and the liquefied metallic interface composition is able to flow onto at least one face of the solid metallic core thereby filling surface asperities.

61. The method of claim 60 wherein the metallic interface composition is thicker near the periphery of the electronic component.

62. The method of claim 60 wherein the solid metallic core includes at least one vent, on at least one face, connecting the space, defined by the metallic seal inner perimeter, to the region outside of the metallic seal outer perimeter.

63. The structure in claim 57 wherein an asperity filling material is disposed on the coating layer, thereby contacting heat exchanger and electronic component.

64. The method of claim 56 wherein the metallic interface composition is liquid at the operating temperature range of the electronic component.

* * * * *